United States Patent
Gosson et al.

(10) Patent No.: US 11,756,565 B2
(45) Date of Patent: Sep. 12, 2023

(54) ANALOG SYSTEMS AND METHODS FOR AUDIO FEATURE EXTRACTION AND NATURAL LANGUAGE PROCESSING

(71) Applicant: blumind Inc., Ottawa (CA)

(72) Inventors: John Gosson, Ottawa (CA); Roger Levinson, San Jose, CA (US); Niraj Mathur, Oakville (CA)

(73) Assignee: blumind Inc., Ottawa (CA)

( * ) Notice: Subject to any disclaimer, the term of this patent is extended or adjusted under 35 U.S.C. 154(b) by 0 days.

(21) Appl. No.: 18/159,162

(22) Filed: Jan. 25, 2023

(65) Prior Publication Data

US 2023/0238014 A1    Jul. 27, 2023

Related U.S. Application Data (60) Provisional application No. 63/302,618, filed on Jan. 25, 2022.

(51) Int. Cl.
| | |
|---|---|
| G06N 3/06 | (2006.01) |
| G10L 21/0232 | (2013.01) |
| G10L 15/05 | (2013.01) |
| G10L 15/16 | (2006.01) |

(52) U.S. Cl.
CPC .......... G10L 21/0232 (2013.01); G10L 15/05 (2013.01); G10L 15/16 (2013.01)

(58) Field of Classification Search
CPC ..... G10L 21/0232; G10L 15/05; G10L 15/16; G06N 3/06
USPC ....................................................... 704/257
See application file for complete search history.

(56) References Cited

U.S. PATENT DOCUMENTS

| | | | |
|---|---|---|---|
| 11,404,106 B2* | 8/2022 | Papageorgiou | G11C 11/54 |
| 11,574,679 B2* | 2/2023 | Yi | G11C 29/021 |
| 11,580,355 B2* | 2/2023 | Niggemeyer | G10L 15/16 |
| 11,636,326 B2* | 4/2023 | Gosson | H03K 5/2472 |
| | | | 706/38 |
| 2017/0329575 A1 | 11/2017 | Gu et al. | |

(Continued)

FOREIGN PATENT DOCUMENTS

WO    2019100036 A1    5/2019

OTHER PUBLICATIONS

International Search Report and Written Opinion for PCT/CA2022/050717, dated Aug. 19, 2022.

(Continued)

*Primary Examiner* — Susan I McFadden
(74) *Attorney, Agent, or Firm* — Own Innovation; James W. Hinton (57) ABSTRACT

An all-analog natural language processing system is provided. Analog audio input is processed directly by an all-analog signal pathway wherein the audio activity detection, voice activity detection, feature extraction and neural network processing are all performed in the analog domain. Audio/voice detection and feature extraction is performed by a bandpass filter bank having a plurality of individual bandpass filters. Each bandpass filter includes an array of individual capacitively coupled current conveyor second order sections having a charge-trap transistor as a programmable element for tuning the passband of the filter. Compared to typical digital systems for natural language processing, the present all-analog system can perform natural language processing with comparable accuracy but greatly reduced energy consumption of up to two orders of magnitude less.

12 Claims, 7 Drawing Sheets

(56) References Cited

U.S. PATENT DOCUMENTS

| | | |
|---|---|---|
| 2020/0211648 A1 | 7/2020 | Minucci et al. |
| 2020/0349421 A1 | 11/2020 | Tran et al. |
| 2020/0364548 A1 | 11/2020 | Chang et al. |
| 2022/0374698 A1 | 11/2022 | Gosson et al. |

* cited by examiner

ANALOG SYSTEMS AND METHODS FOR AUDIO FEATURE EXTRACTION AND NATURAL LANGUAGE PROCESSING

TECHNICAL FIELD

The embodiments disclosed herein relate to audio signal processing including natural language processing, and, in particular to a system and method for analog feature extraction and subsequent neural network processing, such as natural language processing using an audio sensor such as an analog microphone and all analog processing elements.

INTRODUCTION

There has been significant progress in audio processing for sound detection and categorization, most notably for natural language processing for voice detection, keyword spotting and full sentence translation. Most existing systems for natural language processing employ digital solutions.

Figure 1A:
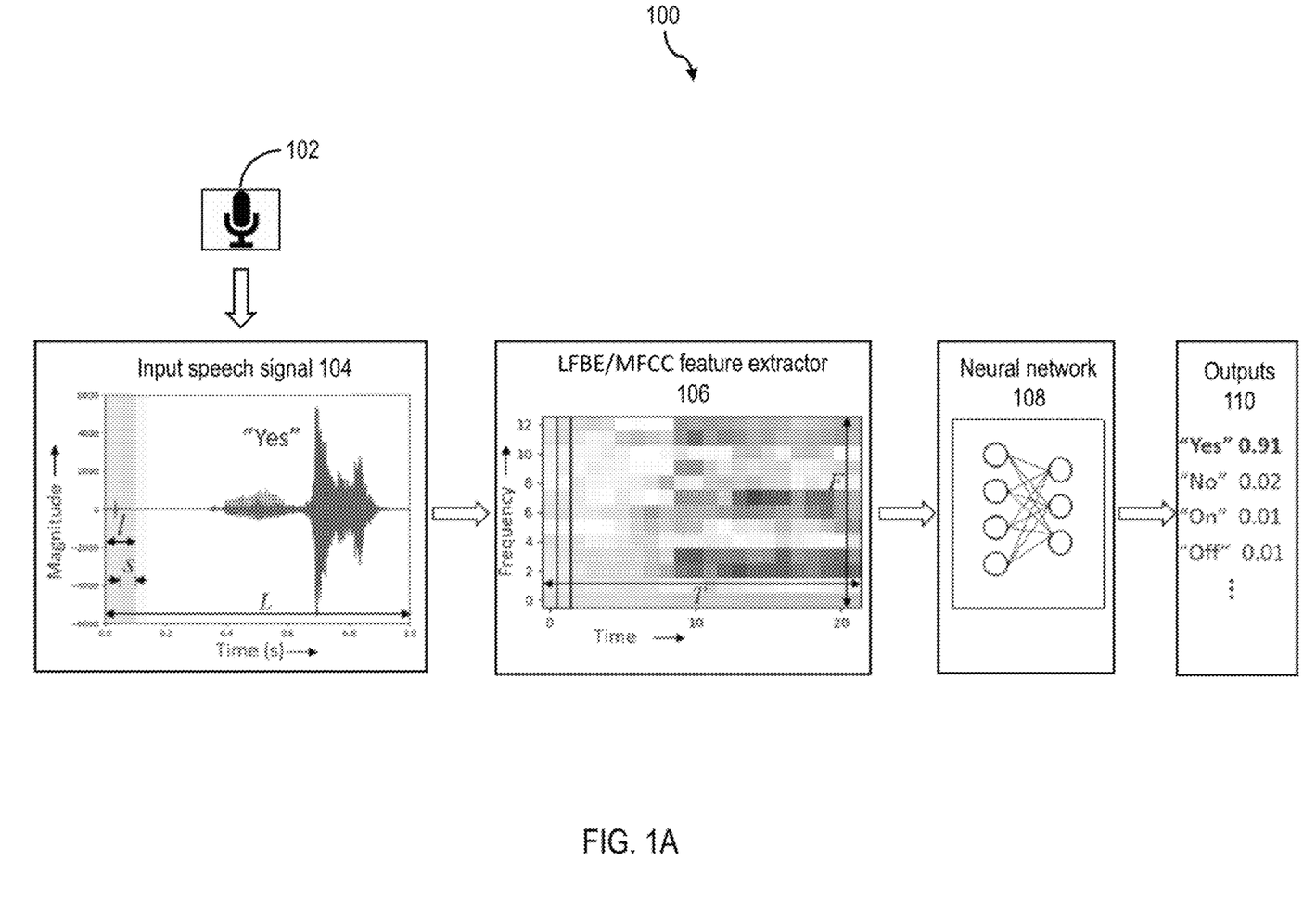
FIG. 1A is a diagram of a typical digital keyword spotting system.

FIG. 1A shows a typical keyword spotting digital system 100. The system 100 may be employed for "always on" audio/voice detection. The digital system 100 includes an analog microphone 102 for receiving audio/voice input. The raw signal from the microphone 102 must be converted from analog to digital (for simplicity, audio activity detection, voice activity detection, analog to digital converter blocks and noise filtering components are not shown), for processing by a logarithm of filter bank energy (LFBE) or mel-frequency cepstrum coefficient (MFCC) feature extractor 106. The feature extractor 106 translates the time-domain speech signal 104 into a set of frequency domain spectral coefficients which enables dimensionality compression of the input signal 104 to extract voice or sound "features". This type of system can be used to identify many classes of audio signals, keywords being one example.

The extracted feature matrix is fed to a neural network classifier 108 for classification of the voice or sound which generates the probabilities for the output classes 110. The neural network 108 can vary (e.g., deep learning neural network (DNN), convolutional neural network (CNN), recurrent neural network (RNN), convolutional recurrent neural network (CRNN)) depending upon the system 100 requirements as can the complexity of the LFBE/MFCC feature extractor 106. Typically, neural network classifiers 108 for natural language processing can include 220 thousand to 1.4 million 8-bit parameters. In a real-world scenario where keywords need to be identified from a continuous audio stream, a posterior handling module (not shown) averages the output probabilities of each output class over a period of time, improving the overall confidence of the prediction.

A limitation of existing digital systems 100 include high power consumption, which is problematic for battery powered or other severely power constrained applications. The total power consumption of the complete system 100 is the summation of the power consumption of all the components including the microphone 102, analog to digital converter, audio and voice activity detection, noise filtering, the LFBE/MFCC feature extractor 106 and the neural network classifier 108. In particular, significant power consumption is required for converting the analog voice signal to a digital signal for processing by the LFBE/MFCC feature extractor 106 and neural network classifier 108. For extremely low power digital solutions, the total power consumption of the system 100 can be as low as 250-500 µW.

Figure 1B:
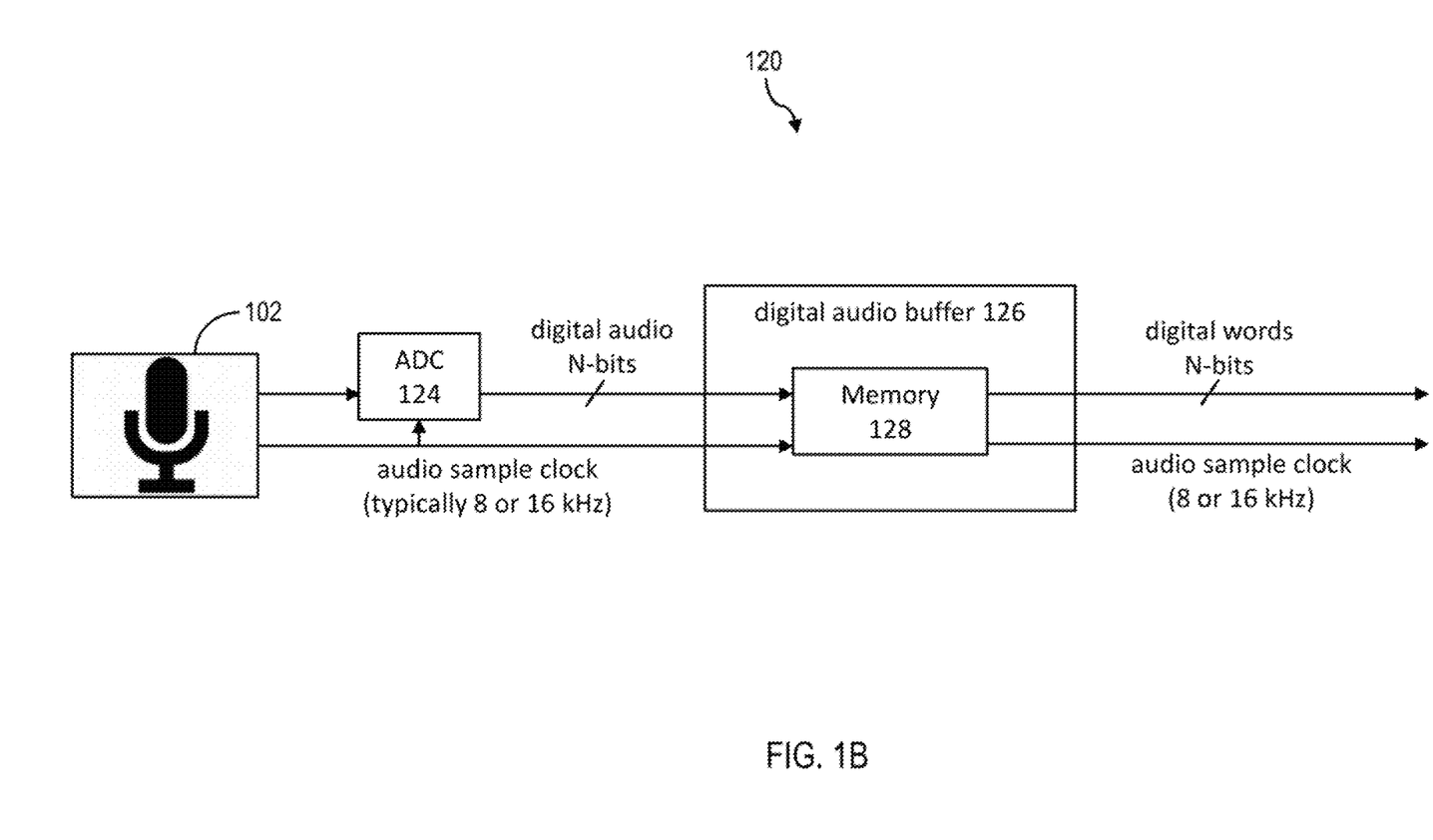
FIG. 1B is a diagram of a typical digital audio buffer.

Referring to FIG. 1B, another limitation for a digital always-on voice system 120 is an audio buffer 126, typically in the range of 500 ms up to 10 s, is required for replay of the audio signal to further process keywords. This buffering function can typically consume excess power because the audio input signal is converted from analog to digital, then stored in a standard memory 128, such as an SRAM, and the read back out through a digital port. This typical implementation requires a precise analog-to-digital converter 124 to maintain signal integrity in the system 120. The input data to the buffer 126 is digital, requiring N-input and N-output bits, which can be driven either serially or parallel, each of which consumes significant power. Accordingly, there is a need for new and improved systems and methods for natural language processing that conserve power by performing the entire language processing function in the analog domain.

SUMMARY

According to some embodiments, an all-analog natural language processing system is provided. Analog audio input is processed directly by an all-analog signal pathway wherein the audio activity detection, voice activity detection, feature extraction and neural network processing are all performed in the analog domain. Audio/voice detection and feature extraction is performed by a bandpass filter bank having a plurality of individual bandpass filters. Each bandpass filter includes an array of individual capacitively coupled current conveyor second order sections having a charge-trapped transistor as a programmable element for tuning the passband of the filter. Compared to typical digital systems for natural language processing, the present all-analog system can perform natural language processing with comparable accuracy but greatly reduced energy consumption of up to two orders of magnitude less.

Other aspects and features will become apparent, to those ordinarily skilled in the art, upon review of the following description of some exemplary embodiments.

BRIEF DESCRIPTION OF THE DRAWINGS

The drawings included herewith are for illustrating various examples of articles, methods, and apparatuses of the present specification. In the drawings.

DETAILED DESCRIPTION

Various apparatuses or processes will be described below to provide an example of each claimed embodiment. No embodiment described below limits any claimed embodiment and any claimed embodiment may cover processes or apparatuses that differ from those described below. The claimed embodiments are not limited to apparatuses or processes having all of the features of any one apparatus or process described below or to features common to multiple or all of the apparatuses described below.

One or more systems described herein may be implemented in computer programs executing on programmable computers, each comprising at least one processor, a data storage system (including volatile and non-volatile memory and/or storage elements), at least one input device, and at least one output device. For example, and without limitation, the programmable computer may be a programmable logic unit, a mainframe computer, server, and personal computer, cloud-based program or system, laptop, personal data assistance, cellular telephone, smartphone, or tablet device.

Each program is preferably implemented in a high-level procedural or object-oriented programming and/or scripting language to communicate with a computer system. However, the programs can be implemented in assembly or machine language, if desired. In any case, the language may be a compiled or interpreted language. Each such computer program is preferably stored on a storage media or a device readable by a general or special purpose programmable computer for configuring and operating the computer when the storage media or device is read by the computer to perform the procedures described herein.

A description of an embodiment with several components in communication with each other does not imply that all such components are required. On the contrary, a variety of optional components are described to illustrate the wide variety of possible embodiments of the present invention.

Further, although process steps, method steps, algorithms or the like may be described (in the disclosure and/or in the claims) in a sequential order, such processes, methods and algorithms may be configured to work in alternate orders. In other words, any sequence or order of steps that may be described does not necessarily indicate a requirement that the steps be performed in that order. The steps of processes described herein may be performed in any order that is practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article.

Figure 2:
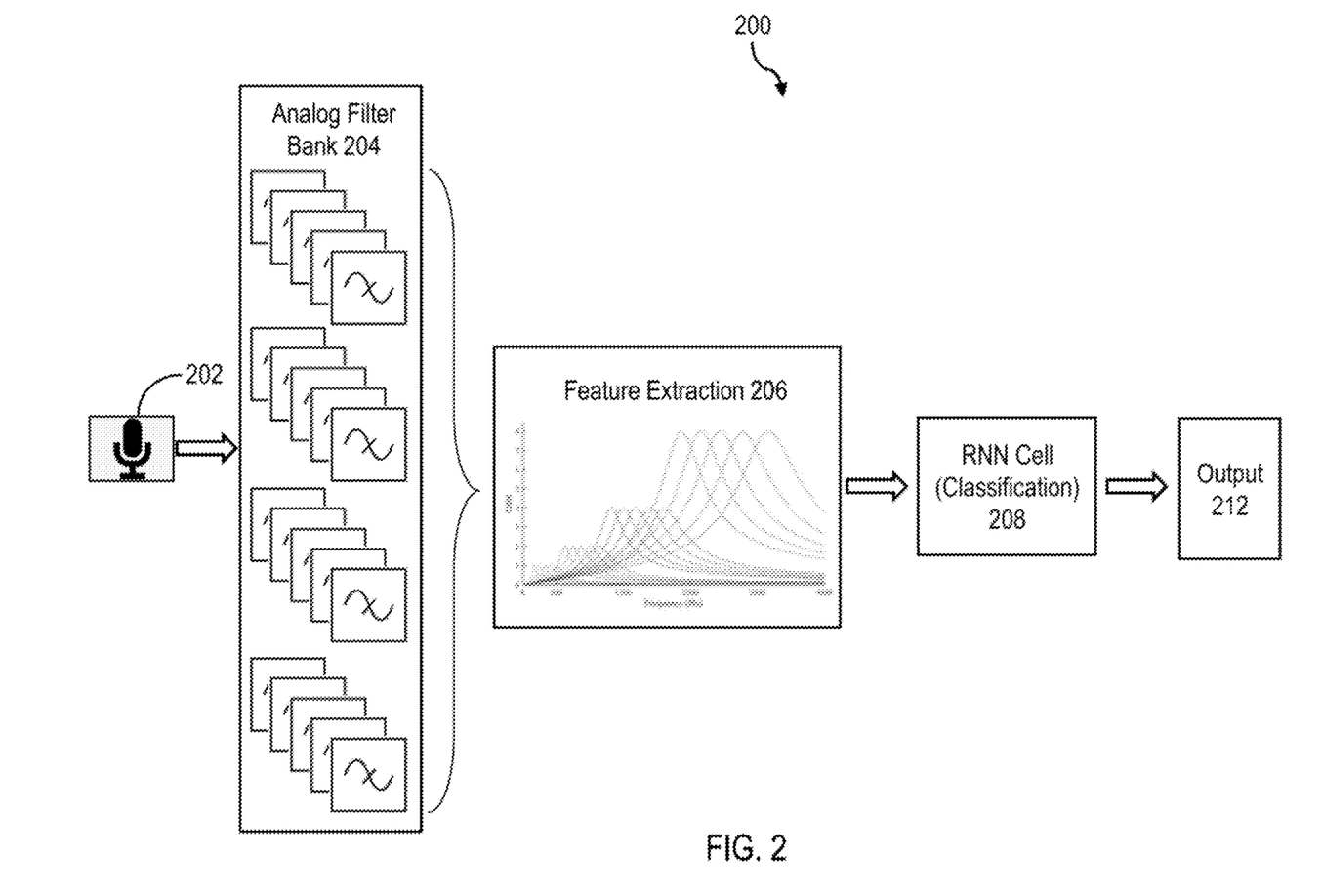
FIG. 2 is a diagram of an all-analog natural language processing system, according to an embodiment.

Referring to FIG. 2, shown therein is an all-analog natural language processing system 200, according to an embodiment. The system 200 includes an audio sensor, for example, analog microphone 202 for receiving audio/voice input. The microphone's 202 analog signal is processed directly by an all-analog signal pathway wherein the audio activity detection, voice activity detection, feature extraction for natural language processing and neural network processing are all performed in the analog domain. By providing an all-analog processing pathway, the system 200 has an energy consumption on the order of 1-10 μW—nearly two orders of magnitude less than the digital system 100 in FIG. 1A.

The system 200 includes a programmable analog bandpass filter bank 204 for audio/voice detection and feature extraction. The filter bank 204 is configurable to have between 4 and 20 programmable analog bandpass filters configured for voice or sound detection and feature extraction 206. The analog bandpass filters are described in more detail with reference to FIG. 3, below. The filter bank 204 may include an analog peak detector circuit (not shown) for thresholding and detecting peak energy in a frequency band or channel of interest. The filter bank 204 may further include an integrator (see FIG. 4) for outputting the accumulated energy within a particular frequency band over a given period of time.

The filter bank 204 may approximate the response of the basilar membrane (in a human ear) to receiving audio/voice input. For example, the filter bank 204 may be configured to model the velocity coupling of the cochlear fluid with the cilia of the inner hair cell by a time derivative.

Beneficially, the analog filter bank 204 eliminates the need to convert the raw analog signal to a digital signal, thereby conserving significant power consumption, and further performs the feature extraction function of the LFBC/MFCC feature extractor 106 in FIG. 1A. Furthermore, the analog filter bank 204 may be more robust to audio signal noise compared to digital systems (i.e., MFCC feature extraction techniques).

The analog filter bank 204 feeds directly into a neural network 208, which can be of several different types with a recursive neural network (RNN) 208 shown in FIG. 2. The uniqueness of this solution is utilizing an all-analog signal processing chain from the microphone 202 through the classification output 212. The RNN 208 may include ~50K parameters for audio/voice feature classification. The RNN 208 may be configured to process up to 100 inferences in a 1 second query. The RNN 208 may be configured to support voice activity detection (VAD) and/or audio activity detection (AAD). In certain embodiments, the bank of band pass filters may be eliminated and the RNN can be enhanced to extract the features as well.

The all-analog neural network 208 can be built in many ways but the preferred embodiment utilizes a neural signal processor in which charge trap transistors (CTT) perform parameter storage and multiplication and a conversion block performs accumulation and activation generation, for example, as disclosed in U.S. Patent Publication No. 2022/0374698, wholly incorporated by reference herein.

Figure 3:
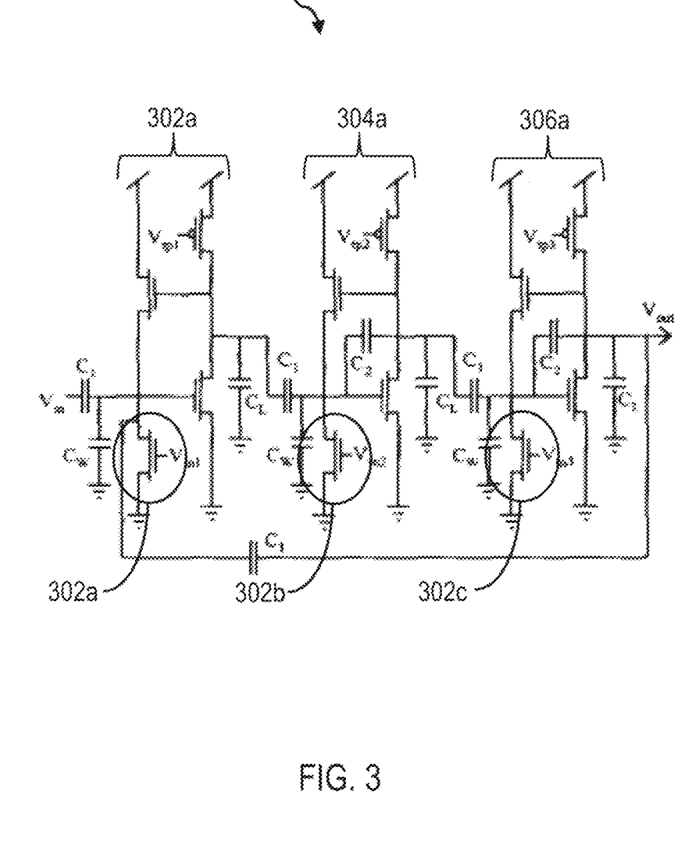
FIG. 3 is a diagram of an analog bandpass filter, according to an embodiment.

Referring to FIG. 3, shown there is a diagram of an analog bandpass filter 300, according to an embodiment. The analog bandpass filter 300 utilizes CTTs 302a, 302b, 302c as the programmable or adjustable element in a second-order charge-coupled conveyor filter structure. A conveyor filter structure is typically implemented using floating-gate analog integrated circuit (VLSI) technology and may be adapted for use in the all-analog system 200 by inclusion of CTTs 302a, 302b, 302c into the conveyor filter structure of the analog bandpass filter 300 to program the filter characteristics.

The bandpass filter 300 is a continuous-time bandpass filter and may include an array of individual capacitively coupled current conveyor second order sections 304a, 304b, 304c. Each second order section 304a, 304b, 304c includes a CTT 302a, 302b, 302c as a programmable element for tuning the corner frequencies of the bandpass filter 300. The corner frequencies may be set independently of each other, thus the bandwidth of the filter 300 may be tuned as required to isolate a given frequency or passband. For example, the array of second order sections 304a, 304b, 304c with exponentially spaced center frequencies forms a good model of the frequency response of the human cochlea.

The analog bandpass filter 300 may correspond to one channel in a multi-channel analog bandpass filter bank 204 having a plurality of 4 to 20 individual analog bandpass filters 300. In such case, each analog bandpass filter 300 (and each channel) may be spaced to cover a segment of the frequency range from 100 Hz to 4000 Hz. Having multiple analog bandpass filters 300 in the filter bank 204 provides for parallel computation ability that consumes orders of magnitude less power than similar digital systems.

Figure 4:
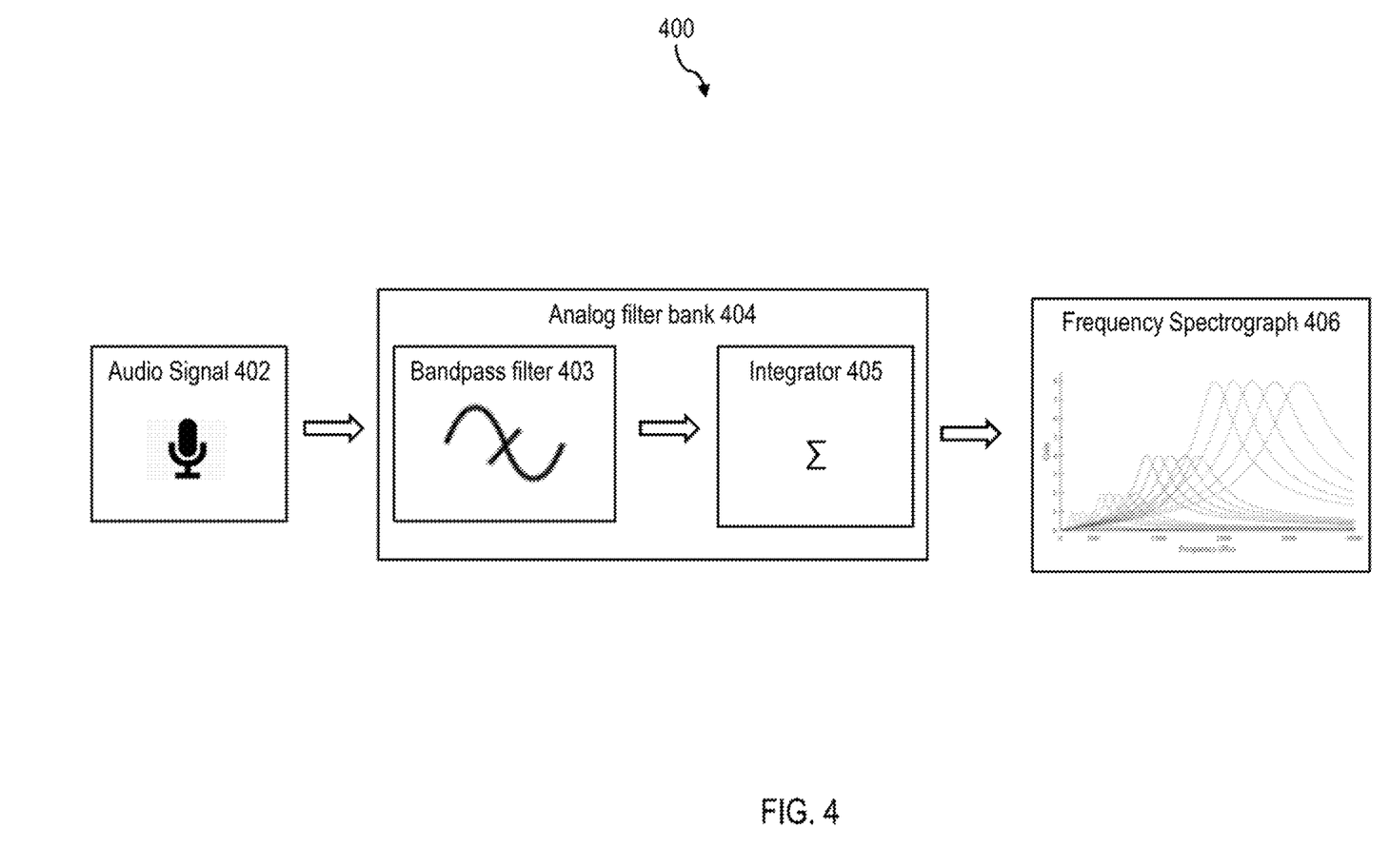
FIG. 4 is a diagram of a bandpass channel for feature extraction, according to an embodiment.

Referring to FIG. 4, shown therein is a diagram of a (single) bandpass channel 400 for feature extraction, according to an embodiment. The bandpass channel 400 may be one of several bandpass channels for feature extraction implemented in the all-analog natural language processing system shown in FIG. 2.

Audio signal 402 from a microphone passes through a bandpass filter 403 in an analog filter bank 404. Each output of the bandpass filter 403 is followed by an integrator 405 to provide an output that represents the accumulated energy within the particular frequency band of the bandpass filter 403 over a given period of time, the integration time. The integrator 405 may be a variety of known implementations for signal integration.

The outputs of the integrators 405 in the analog filter bank 404 provides a frequency spectrograph 406 of the audio signal 402 input and is thus capable of replacing the typical MFCC function in digital systems. The frequency spectrograph 406 is processed by a neural network configured for audio activity detection, voice activity detection and natural language processing.

Figure 5:
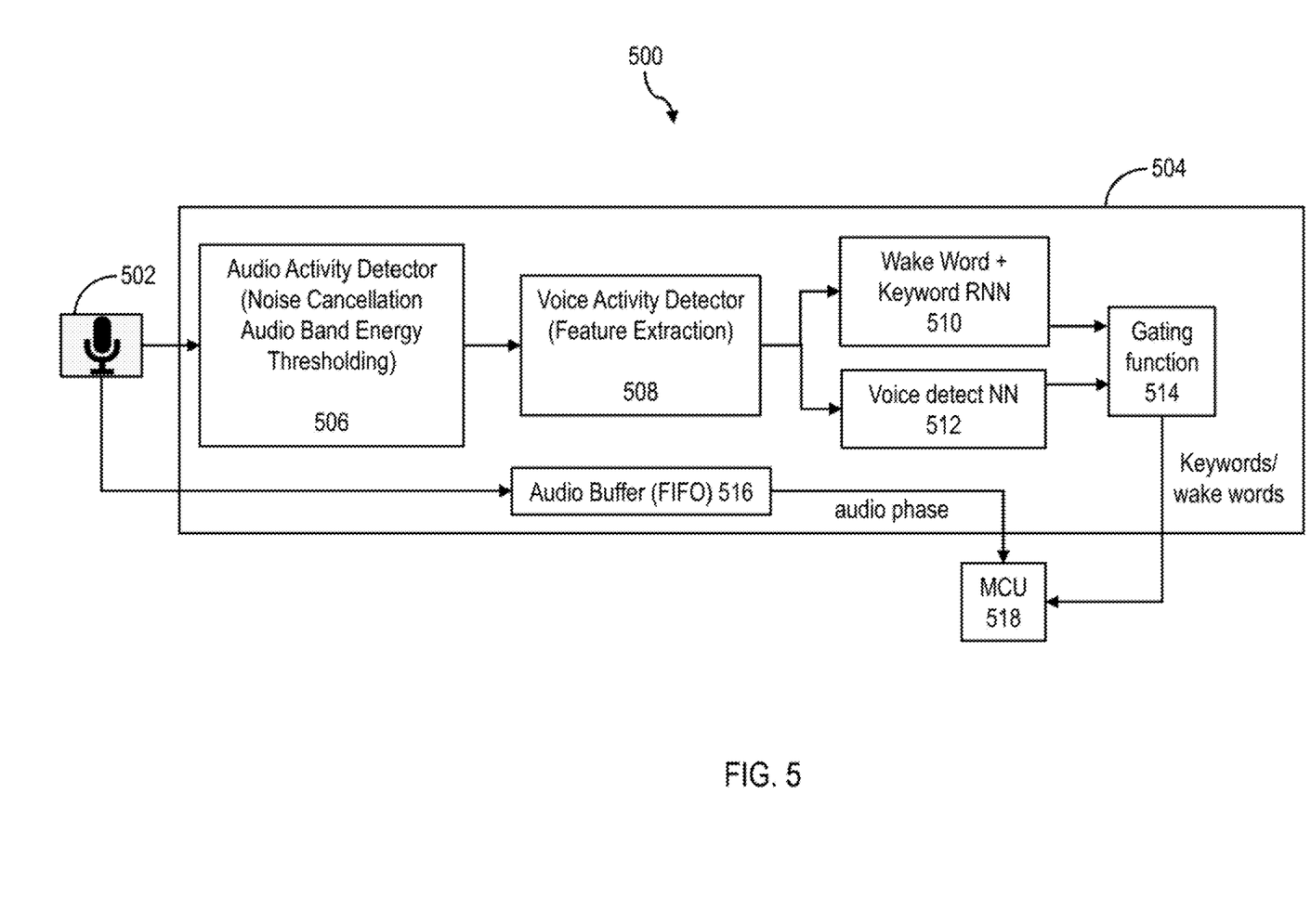
FIG. 5 is a block diagram of an always-on analog natural language processing system, according to an embodiment.

Referring to FIG. 5, shown there is a diagram of an always-on all-analog natural language processing system 500, according to an embodiment. The always-on audio system 500 includes an analog microphone 502. According to some embodiments, the microphone 502 is an analog micro electro-mechanical system (MEMS) microphone 502.

Audio/voice input to the microphone 502 is received by an always-on all-analog audio processing system 504. The audio processing system 504 may be a system-on-a-chip, that includes analog audio processing components. According to an embodiment, the audio processing system 504 may be combined with the microphone 502, for example, to form a system in module.

The all-analog audio processing system 504 includes an audio activity detector 506. The audio activity detector 506 may include an analog bandpass filter bank (e.g., bandpass filter bank 202 in FIG. 2) configured for noise cancellation and audio band energy thresholding. According to an embodiment, the audio activity detector 506 may be added to the microphone 502 itself.

The all-analog audio processing system 504 includes a voice activity detector 508. The voice activity detector 506 may include an analog bandpass filter bank (e.g., bandpass filter bank 202 in FIG. 2) configured for voice detection and feature extraction.

In digital systems (FIG. 1A) audio activity detection and voice activity detection are done as separate digital signal processing functions. Advantageously, according to various embodiments, the audio activity detector 506 and voice activity detection 508 may be the same analog filter bank that feeds into a neural network configured for audio activity detection, voice activity detection and/or natural language processing.

The all-analog audio processing system 504 includes one or more neural networks, for example, a wake work and keyword spotting RNN 510 configured for classifying features extracted by the voice activity detector 506 as wake words and keywords, respectively. Wake words may be voice commands for rousing a device from a sleep or a standby mode to a full operational mode. Keywords may be voice commands for a device to perform a particular act or function.

A simpler voice detect RNN 512 functions in parallel to the wake word and keyword spotting RNN 510 to allow the audio processing system 504 to look for wake words and keywords constantly. The output of wake word and keyword spotting RNN 510 is gated by output of the voice detect RNN 512, according to a gating function 514, to ensure that wake words/keywords are detected only when a voice is present to filter erroneous keyword detections in a noisy environment.

In a typical digital always-on audio system, to save power, a wake word neural network is only turned on to detect/classify words when a voice detecting neural network detects the presence of a voice. By comparison, in the analog always-on natural language processing system 500, the benefit of constantly running the wake word and keyword spotting RNN 510 in parallel with the voice detection NN 512 is that the latency to respond to a positive detection of a keyword or wake word is reduced significantly.

According to an embodiment, the neural networks 510, 512 may include ~50K parameters for audio/voice feature classification. The neural networks 510, 512 may each be configured as 3 layers of neurons. The first layer is configured as a recurrent neural network for receiving up to 20 inputs of the extracted features from the audio activity detector 506 and/or voice activity detector 508 filter banks. A second hidden layer is configured to reduce the output of the first layer to a reduced number of activations. A third layer is configured to generate output classes of the keywords and the wake words. According to an embodiment, the voice activity detector 508 may be merged with the wake word RNN 510, wherein the RNN 510 is trained to provide an output that indicates that a voice is present.

The neural networks 510, 512 may be trained for wake work and keyword classification using a keyword and/or wake word classification dataset, for example, Google® Speech Commands or Mozilla™ Common Voice datasets. As an example, when trained with these specific datasets, the system 500 can detect the provided 20 wake words or keywords with >95% accuracy, comparable to traditional digital natural language processing systems. However, compared to digital systems, the energy consumption of the all-analog system 500 is on the order of two orders of magnitude lower.

Still referring to FIG. 5, the input analog signal from the analog microphone 502 is converted to time pulse widths or a phase representation utilizing a dual slope voltage to phase converter including an N-bit counter to generate the audio samples (see FIG. 6) which uses a gated ring oscillator as the time base. The audio samples are stored in a highly optimized, first-in-first-out (FIFO) sub-threshold memory structure 516 to minimize power consumption. The sub-threshold memory structure 516 may be an ephemeral memory structure disclosed in U.S. Patent Publication No. 2022/0374698.

The audio is replayed in several possible manners, including, but not limited to, outputting the digital phase representations directly, or regenerating the analog form of the pulse widths. During regeneration, the gated ring oscillator is used as the time base such that the acquisition of input voltages and regeneration of output signals is all based upon the same time reference. The audio buffer 516 is limited in the amount of time in which any storage element needs to hold any value in any particular memory location, thus the memory elements used to store the phase information can be dynamic, further reducing the power consumption. The audio phase information and detected keywords/wake words output from the audio processing system 504 are received and processed by a microcontroller 518 or processor.

Figure 6:
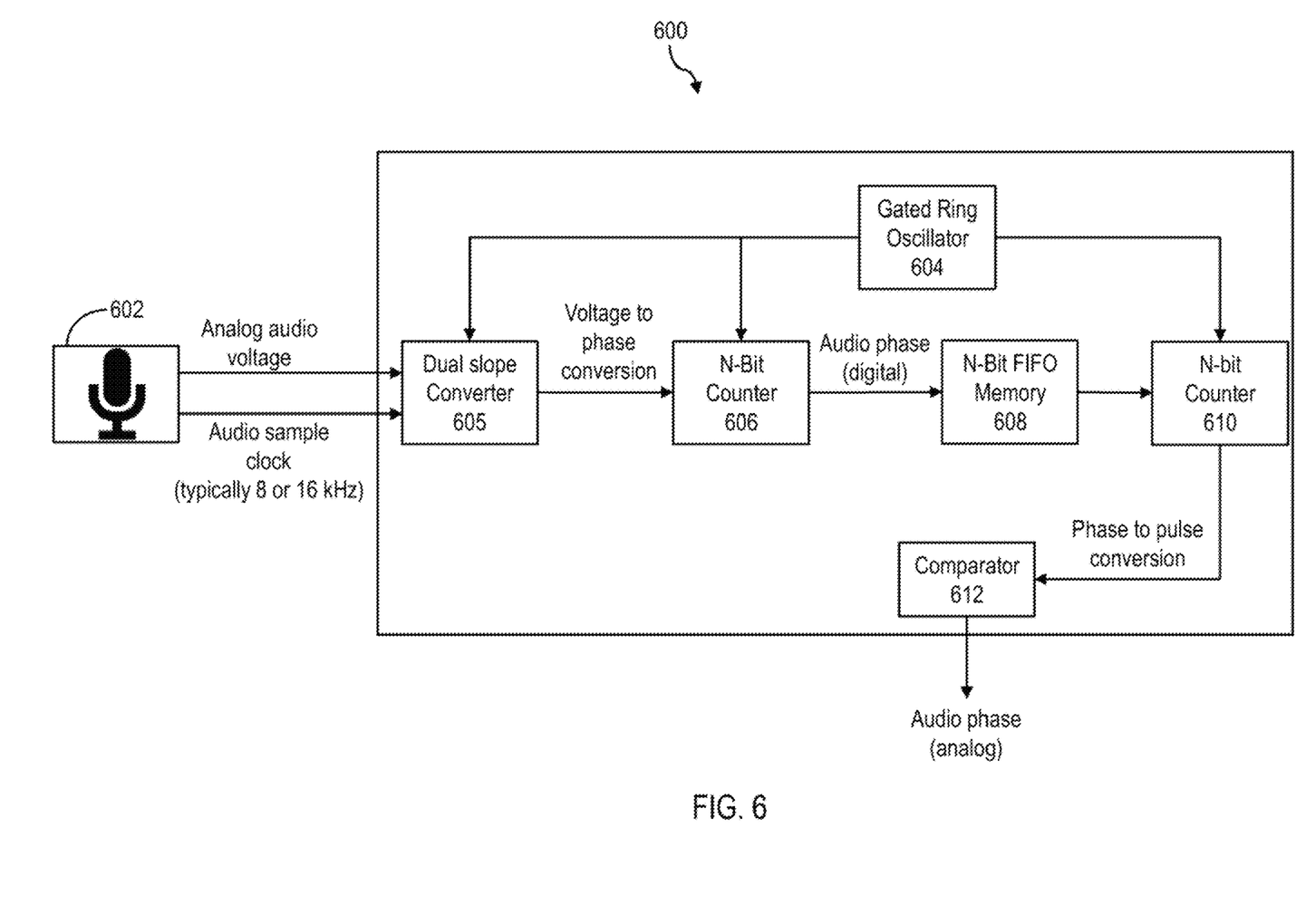
FIG. 6 is a phase-based audio buffer, according to an embodiment.

Referring to FIG. 6, shown therein is a diagram of a phase-based audio buffer 600, according to an embodiment.

The audio buffer 600 may be the audio buffer 516 in FIG. 5. The audio buffer 600 includes a timing element 604. Advantageously, the timing element 604 used to capture the phase information of each audio sample does not need to be absolutely accurate relative to any other timing standard in the system. Since the same time base is used to capture the audio signal phase and regenerate the audio signal, the time base can be asynchronous. This allows for significant simplification of the timing element 604, which can be as simple as the gated ring oscillator 604 running in subthreshold.

The audio buffer 600 converts the audio voltage to a phase representation utilizing a dual-slope voltage to phase converter 605 including an N-bit counter 606 to digitize the audio phase representation for storage in an N-bit FIFO memory structure 608. The audio buffer 600 also converts the phase information to time pulse widths utilizing an N-bit counter 610 and a comparator 612. The comparator 612 compares the time pulses against zero or an arbitrary threshold as the counter 610 counts down and outputs the audio phase as an analog pulse using 1 pin for reduced power. By comparison, a typical digital solution (FIG. 1B) with N-bit bit resolution will require ~N times as much power as the audio buffer 600.

The systems 200, 400, 500 and 600 shown in FIGS. 2, 4, 5 and 6, respectively, may be adapted for applications beyond voice/keyword detection and classification and natural language processing. While the systems 200, 400, 500 and 600 include an analog microphone, the microphone may generally be any analog sensor for detecting vibrations or vibrating particles (e.g., sound waves, ultrasound waves, seismic waves, etc.). Accordingly, the systems 200, 400, 500 and 600 may be adapted for detection and classification of non-voice sounds (e.g., glass breaking), ultrasound features and seismic activity by appropriate tuning of the analog bandpass filters to extract relevant features and training a neural network to classify the relevant features.

While the above description provides examples of one or more apparatus, methods, or systems, it will be appreciated that other apparatus, methods, or systems may be within the scope of the claims as interpreted by one of skill in the art.

The invention claimed is:

1. An analog signal processing system, comprising:
   an analog vibration sensor;
   a first analog filter bank for receiving a signal from the vibration sensor, the first filter bank comprising:
     a plurality of programmable analog bandpass filters configured for feature extraction, wherein each bandpass filter is a continuous-time bandpass filter comprising:
       charge trap transistors as programmable elements for tuning corner frequencies of the bandpass filter; and
   at least one analog neural network configured to receive extracted features from the first filter bank and classify the extracted features.

2. The analog signal processing system of claim 1, wherein the analog vibration sensor is an analog microphone.

3. The analog signal processing system of claim 1, wherein each analog bandpass filter comprises:
   an integrator for outputting accumulated energy within a frequency band of the bandpass filter over a period of time.

4. The analog signal processing system of claim 1, wherein the charge trap transistors are arranged as an array of individual capacitively coupled current conveyor second-order sections.

5. The analog signal processing system of claim 4, wherein the array of second-order sections have exponentially spaced center frequencies to model a frequency response of a human cochlea.

6. The analog signal processing system of claim 1, wherein the at least one analog neural network comprises:
   a neural signal processor having charge trap transistors for performing parameter storage and multiplication; and
   a conversion block for performing accumulation and activation generation.

7. The analog signal processing system of claim 1, wherein the at least one analog neural network comprises:
   a voice activity analog neural network configured to receive extracted features from the first filter bank and classify the extracted features; and
   a word detection analog neural network configured to receive the extracted features from the first filter bank and classify keywords and wake words.

8. The analog signal processing system of claim 7, wherein an output of the word detection neural network is gated by an output of the voice detection neural network.

9. The analog signal processing system of claim 7, wherein the word detection neural network is configured as 3 layers of neurons, comprising:
   a first layer configured as a recurrent neural network for receiving up to 20 inputs of the extracted features from the first filter bank;
   a second hidden layer configured to reduce the output of the first layer to a reduced number of activations; and
   a third layer configured to generate output classes of the keywords and the wake words.

10. The analog signal processing system of claim 1, further comprising:
    an audio detection filter bank for receiving the signal from the vibration sensor, the audio detection filter bank comprising:
      a plurality of tunable analog bandpass filters configured for noise cancellation and audio band thresholding.

11. The analog signal processing system of claim 10, wherein the audio detection filter bank further comprises:
    an analog peak detector circuit for thresholding and detecting peak energy in a frequency band or channel; and
    an integrator for outputting accumulated energy within the frequency band or channel.

12. The analog signal processing system of claim 10, wherein the first filter bank and the audio detection filter bank are a single filter bank.

* * * * *